United States Patent
Breinlinger et al.

(10) Patent No.: US 8,289,039 B2
(45) Date of Patent: Oct. 16, 2012

(54) PIN ELECTRONICS LIQUID COOLED MULTI-MODULE FOR HIGH PERFORMANCE, LOW COST AUTOMATED TEST EQUIPMENT

(75) Inventors: Keith Breinlinger, San Ramon, CA (US); Edward Ostertag, Clinton, WA (US); Ronald A. Sartschev, Andover, MA (US); Nicholas J. Teneketges, Thousand Oaks, CA (US)

(73) Assignee: Teradyne, Inc., North Reading, MA (US)

( * ) Notice: Subject to any disclaimer, the term of this patent is extended or adjusted under 35 U.S.C. 154(b) by 354 days.

(21) Appl. No.: 12/402,380

(22) Filed: Mar. 11, 2009

(65) Prior Publication Data

US 2010/0231250 A1    Sep. 16, 2010

(51) Int. Cl.
G01R 31/00 (2006.01)
G01R 31/10 (2006.01)

(52) U.S. Cl. .......... 324/750.03; 324/750.14; 324/756.07
(58) Field of Classification Search ............. 324/750.03, 324/750.14, 756.07
See application file for complete search history.

(56) References Cited

U.S. PATENT DOCUMENTS

| | | | |
|---|---|---|---|
| 3,706,010 A | 12/1972 | Laermer et al. | |
| 4,298,905 A | 11/1981 | Bosler et al. | |
| 4,331,830 A | 5/1982 | Conway et al. | |
| 4,883,429 A | 11/1989 | Suzuki et al. | |
| 4,924,179 A * | 5/1990 | Sherman | 324/756.02 |
| 5,380,956 A | 1/1995 | Loo et al. | |
| 5,426,563 A | 6/1995 | Moresco et al. | |
| 5,509,468 A | 4/1996 | Lopez | |
| 5,510,958 A | 4/1996 | Shimabara et al. | |
| 5,740,018 A | 4/1998 | Rumbut, Jr. | |
| 6,019,167 A | 2/2000 | Bishop et al. | |
| 6,621,707 B2 * | 9/2003 | Ishimine et al. | 361/721 |
| 6,644,058 B2 | 11/2003 | Bash et al. | |
| 6,646,879 B2 * | 11/2003 | Pautsch | 361/699 |
| 6,700,396 B1 | 3/2004 | Smith et al. | |
| 6,717,812 B1 | 4/2004 | Pinjala et al. | |
| 6,807,056 B2 * | 10/2004 | Kondo et al. | 361/689 |
| 6,817,204 B2 | 11/2004 | Bash et al. | |
| 6,865,080 B2 | 3/2005 | Radosevich et al. | |

(Continued)

FOREIGN PATENT DOCUMENTS

KR    10-2006-0023569    3/2006

OTHER PUBLICATIONS

A.C.Pfahnl, et al., Heat Sinks Reactively Solderd to ICs, DesignCon East 2004, Apr. 5, 2004, published at http://www.mtfoil.com/technology/tech.html.

(Continued)

*Primary Examiner* — Roberto Velez
(74) *Attorney, Agent, or Firm* — Wolf, Greenfield & Sacks, P.C.

(57) ABSTRACT

In one embodiment, a channel board-to-DIB junction multi-module is provided which includes performance critical channel electronics modules within an enclosure encasing the plurality of performance critical channel electronics modules. A coolant distribution apparatus is provided within the enclosure to provide cooling within the enclosure. A channel board connection apparatus is located at a channel board end of the channel board-to-DIB junction multi-module and a cable-less connection apparatus is located at a DIB end of the channel board-to-DIB junction multi-module.

25 Claims, 13 Drawing Sheets

U.S. PATENT DOCUMENTS

| | | |
|---|---|---|
| 6,880,350 B2 * | 4/2005 | Tilton .............................. 62/171 |
| 6,909,607 B2 | 6/2005 | Radosevich et al. |
| 6,937,471 B1 | 8/2005 | Haws et al. |
| 6,955,062 B2 | 10/2005 | Tilton et al. |
| 6,965,514 B2 | 11/2005 | Beihoff et al. |
| 6,966,784 B2 | 11/2005 | Van Schuylenbergh et al. |
| 6,972,957 B2 | 12/2005 | Beihoff et al. |
| 6,982,873 B2 | 1/2006 | Meyer et al. |
| 7,012,807 B2 | 3/2006 | Chu et al. |
| 7,095,612 B2 | 8/2006 | Beihoff et al. |
| 7,121,859 B2 | 10/2006 | Van Schuylenbergh et al. |
| 7,285,851 B1 | 10/2007 | Cepeda-Rizo et al. |
| 7,457,117 B2 * | 11/2008 | Yip et al. ...................... 361/698 |
| 2007/0159797 A1 | 7/2007 | Teneketges et al. |

OTHER PUBLICATIONS

International Search Report for PCt/US2010/026881 dated Sep. 17, 2010, 8pgs.

* cited by examiner

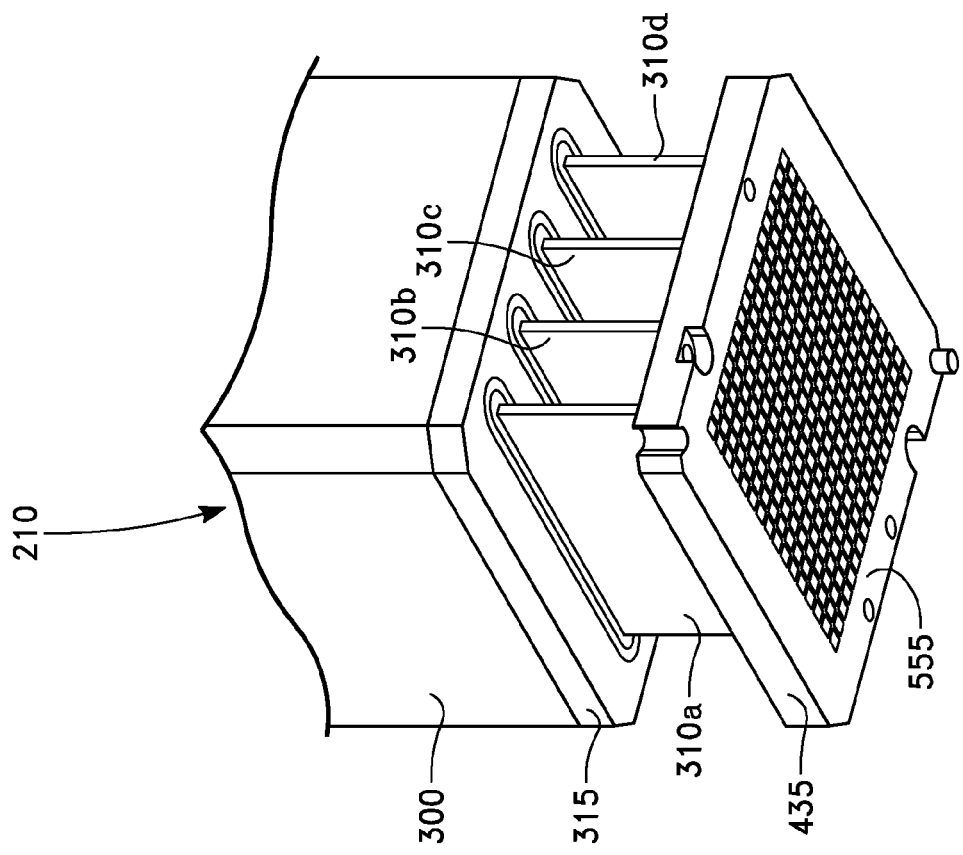
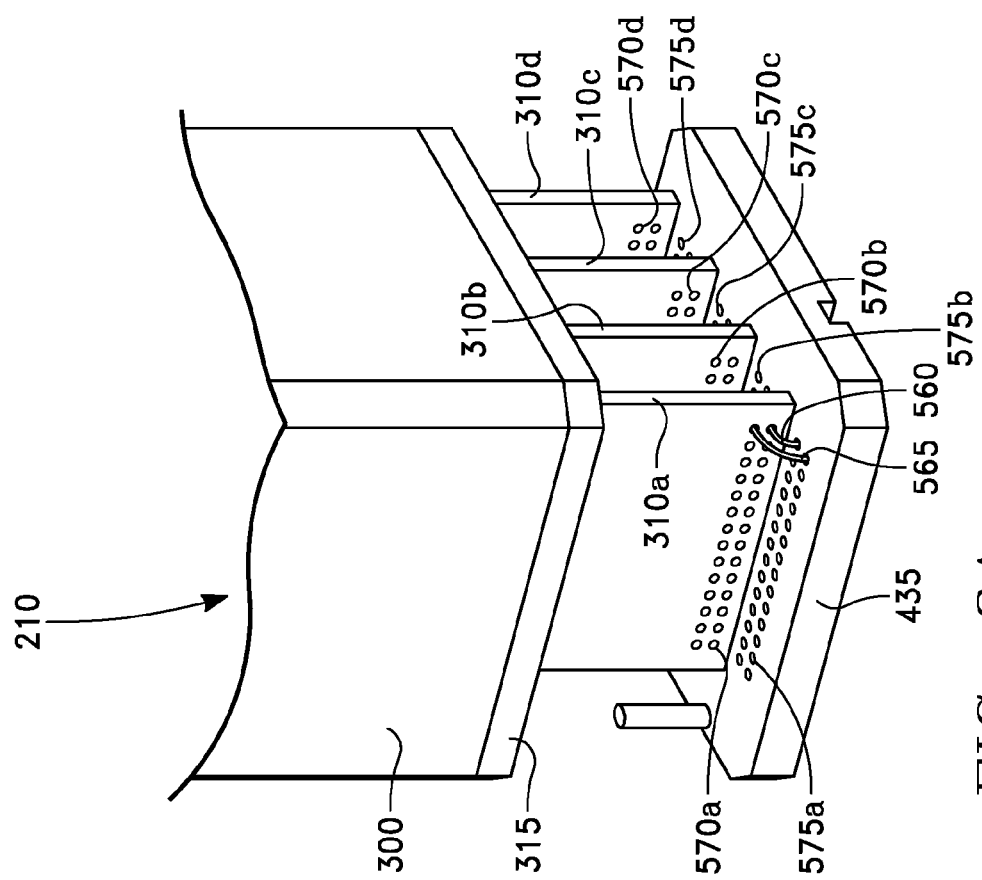

PIN ELECTRONICS LIQUID COOLED MULTI-MODULE FOR HIGH PERFORMANCE, LOW COST AUTOMATED TEST EQUIPMENT

BACKGROUND

As integrated circuits have become increasingly dense according to Moore's Law, the automatic test equipment systems that evaluate functionality and performance, must be able to fit higher numbers of communication pathways or channels on the instrumentation boards for providing stimulus signals to and receiving response signals from the integrated circuit devices under test. These higher circuit densities have led to increasing connection densities and increasing clock speeds and decreasing circuit delay times. These performance requirements have also led to increasingly higher power densities within the circuits of the automatic test equipment systems. With no corresponding improvement for heat transfer technology as is indicated by Moore's law, the cooling demands have increased over time from natural convection in the 1970's to indirect liquid cooling using expensive vacuum-brazed cold plates of the current art.

Further the lower delay times and the higher clock rates have created signals that must be transmitted on coaxial cables or equivalent high speed cabling. The performance requirements of integrated circuits have forced the use of one or even two coaxial cables to the device-under-test. Further, these requirements have even forced the use of coaxial cables with larger conductors. The coaxial cable bundles are physically long, wide, and heavy. Timing accuracy is becoming limited by signal degradation in the path from the main electronic test control circuits to the test head which connects to the device-under-test.

The present inventor has further realized that the increasing number of channels and the performance requirements has made it impractical to continue packaging most of the test circuits that communicate directly with the device-under-test in with the main electronic test control circuits. The performance and miniaturization of transistors on integrated circuits in present and future technologies have resulted in cable challenges in the pathways between the test circuitry and the physical device interface board that receives the device-under-test. The sheer volume of several thousand 2-foot coaxial cables is causing problems for repeatably routing and restraining the mass of heavy and expensive coaxes. Design compromises between cable diameter and signal fidelity are impacting the performance of the integrated circuit automatic test systems.

Therefore, what is needed is a way to allow high performance test at high density and high clock speeds.

SUMMARY

In one embodiment, a channel board-to-DIB junction multi-module is provided which includes performance critical channel electronics modules within an enclosure encasing the plurality of performance critical channel electronics modules. A coolant distribution apparatus is provided within the enclosure to provide cooling within the enclosure. A channel board connection apparatus is located at a channel board end of the channel board-to-DIB junction multi-module and a cable-less connection apparatus is located at a DIB end of the channel board-to-DIB junction multi-module.

BRIEF DESCRIPTION OF THE DRAWINGS

FIGS. 8A-8C are perspective views of an embodiment of the connection system of the compliant-pressure connector between a device interface board and the one channel board-to-DIB junction multi-module.

DESCRIPTION

The present inventors have realized that what is needed is automatic test equipment pin electronics packaged with most of the test circuits (pin electronics) that communicate directly with the device-under-test in close proximity to the device interface board (DIB) for short communication distance with the device-under-test (DUT). What is needed is for the drivers and comparators of the pin electronics to have cable-less access to the device-under-test.

Figure 1A:
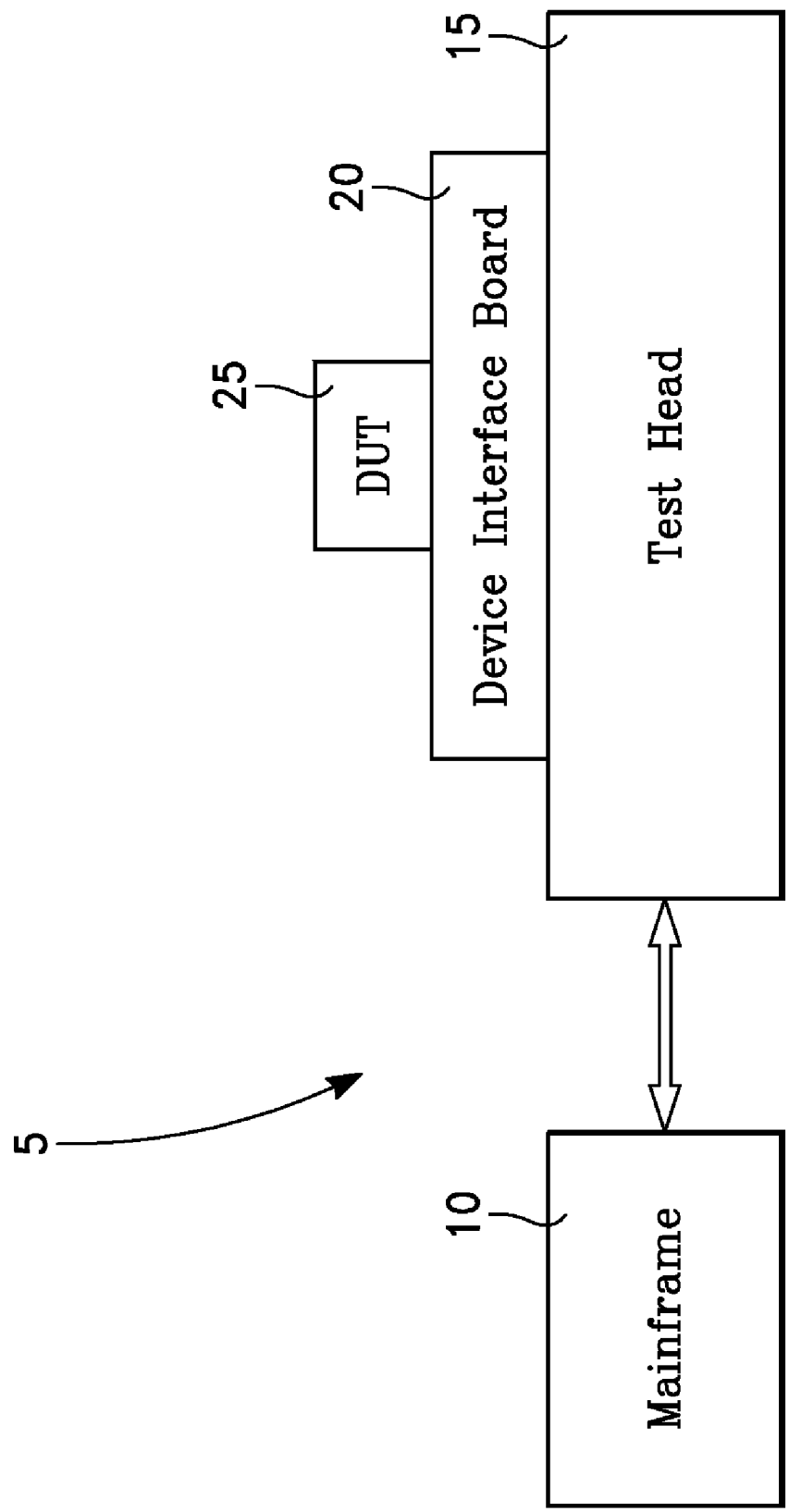
FIG. 1A is a simplified block diagram of an automatic test equipment system.

FIG. 1A is a simplified block diagram of an automatic test equipment system. Automatic test equipment 5 includes a test control mainframe 10 that is in communication with a test head 15. The test head 15 is connected to a device interface board (DIB) 20. In some embodiments, signals from the test head 15 may be routed to the device interface board 20. In operation, the device interface board 20 is electrically connected to a device-under-test (DUT) 25 for testing the device-under-test 25. For example, the automated test equipment (ATE) system 5 may be for testing integrated circuits, and the device-under-test 25 may be a semiconductor device including an integrated circuit. As described above, signals from the test head 15 may be routed through cables (not shown) to the device interface board 20.

The test control mainframe 10 includes circuitry for generating test signals and evaluating test signals. The tester mainframe 10 sends test signals to the device-under-test 25 and receives test signals from the device-under-test 25 through the test head 15 and the interface board 20. The device-under-test 25 may be a packaged silicon die including an integrated circuit to be tested. In another embodiment, the interface board 20 is a probe interface board, and the device-under-test 25 may be a semiconductor wafer including an integrated circuit to be tested.

As noted above integrated circuits have become increasingly dense, have higher performance, and must dissipate more power. The automatic test equipment systems 5 that evaluate functionality and performance must be able to fit higher numbers of communication pathways or channels on the instrumentation boards of the test head 15 for providing stimulus signals and receiving response signals to and from the integrated circuit devices-under-test 25. Further automatic test equipment 5 must now also dissipate increasingly higher power densities to the circuits of the test head 15. Additionally, the automatic test equipment systems 5 must provide the necessary signal fidelity to enable the stimulus and response signals to be interpreted correctly.

Figure 1B:
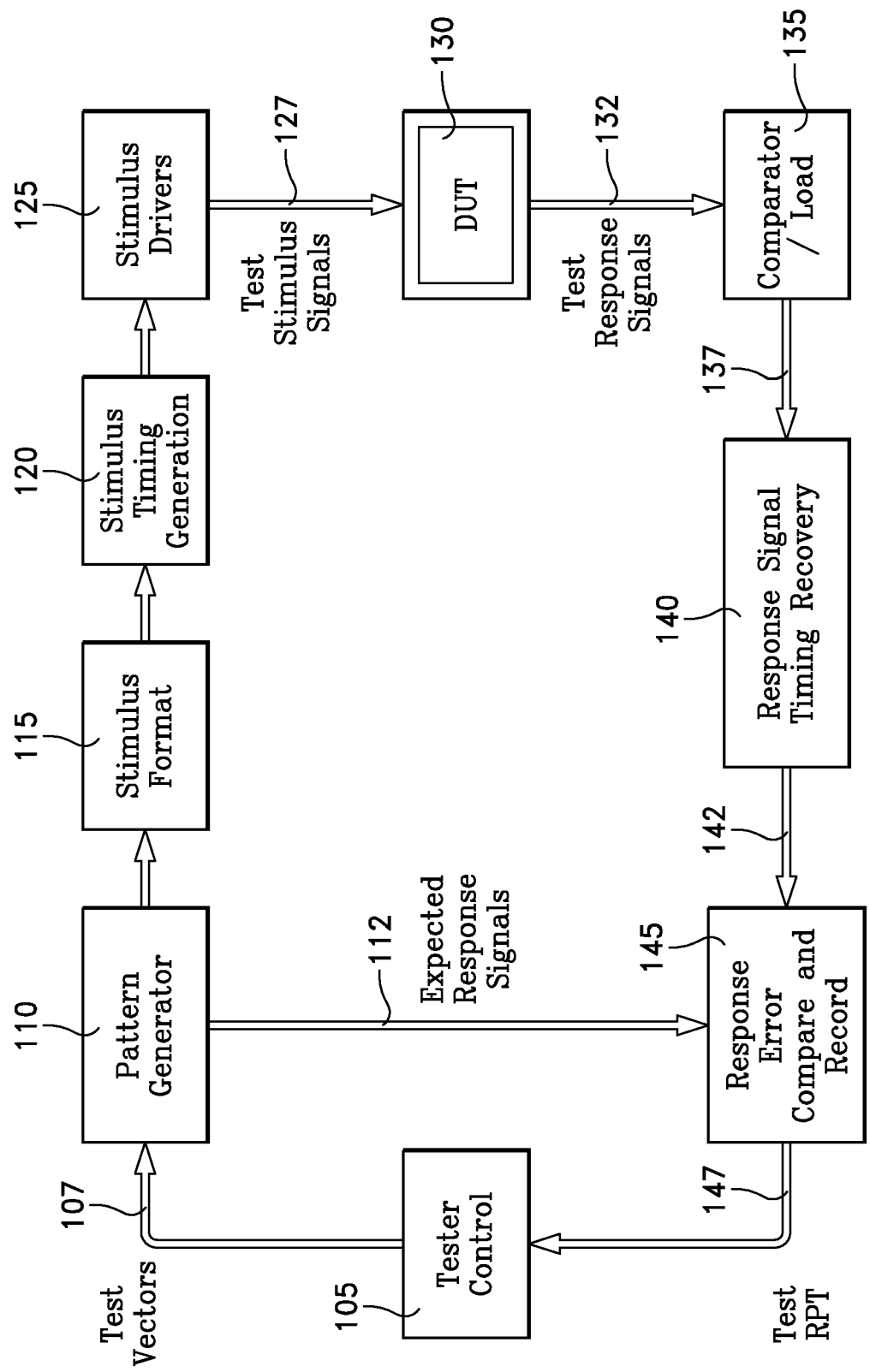
FIG. 1B is a simplified block diagram of an automatic test equipment system channel pathway from a tester controller to a device-under-test.

FIG. 1B is a simplified block diagram of an automatic test equipment system channel pathway from a tester controller to a device-under-test. Automatic test equipment has a tester control unit 105 that provides overall functional control for parametric and functional testing of a device-under test 130. The definition of the parametric and functional testing is described in test vectors 107 that are stored and dispatched to the individual channels that provide the stimulus input test signals and monitor the response output signals of the device-under-test 130. The test vectors 107 are transferred to a test pattern generator 110. The test pattern generator 110 decodes the test vectors 107 to determine the specific pattern of stimulus test signals for each channel and thus for each input or output pin of the device-under-test 130. The output of the test pattern generator 110 is the stimulus test signal formatter 115. The stimulus test signal formatter 115 receives the generated test stimulus signals and formats the signals for correct voltage amplitude and sequence for ordered test vectors. The output of the stimulus test signal formatter 115 is the test stimulus signal timing generator 120. The test stimulus signal timing generator 120 adjusts the timing of the stimulus test signals such that they are correctly aligned to meet the timing specifications of the device-under-test 130. The output of the test stimulus signal timing generator 120 is the input to the test stimulus signal drivers 125. The test stimulus signal drivers 125 provide the appropriate source impedance and driving current and voltage to meet the input requirements of the device-under-test 130. The test stimulus signals 127 from the test stimulus signal drivers 125 are applied to the device-under-test 130.

The test response signals 132 are the signals generated by the device-under-test 130 in response to the inputs of the test stimulus signal drivers 125 and are the inputs to the test response comparator/load circuits 135. The test response comparator/load circuits 135 provide the appropriate termination load devices for the transmission lines (printed circuit lands, connectors, and cables) that carry the test response signals 132. The test response comparator/load circuits 135 further have comparator circuits for determining a voltage state of the test response signals 132. If the test response signals 132 are logic signals, this is the logical 1 or logical 0 or the logic state. Alternately, if the test response signals 132 are analog signals the comparators may in fact be analog to digital converters for sampling the analog test response signals 132 for further evaluation.

The recovered test response signals 137 are transferred from the test response comparator/load circuits 135 to test response signal timing recovery circuit 140. The test response signal timing recovery circuit 140 establishes the timing of the recovered test response signals 137 to insure that the recovered test response signals 137 are correctly received relative to the timing of the device-under-test 130. The recovered and timed test response signals 142 are then conveyed to the test response signal error compare and recording circuit 145. The test response signal error compare and recording circuit 145 receives an expected response signal 112 from the test pattern generator 110 for comparison to the recovered and timed test response signals 142. The outcome of the comparison is compiled to become a test result report 147 that is conveyed to the tester control unit 105 for further processing and evaluation.

Returning to FIG. 1A the automatic test equipment system 5 of various embodiments provides pin electronics packaged within the test head 15 to communicate directly with the device-under-test 25 in close proximity to the device interface board 20 (DIB). The pin electronics is directly connected to the device interface board 20 through compliant/compression connectors that provide for short communication distance with the device-under-test 25. The high-performance electronics of the automatic test equipment structure of FIG. 1B such as the drivers and comparators of the pin electronics thus may be provided cable-less access to the device-under-test. Further, as the integration levels and the performance requirements for the automatic test equipment 5 increase, the pattern generation, pattern formatting, timing generation, timing recovery, response formatting, and error determination and recording may be incorporated into the pin electronics package apparatus within the test head 15 of an embodiment. The increased density of the pin electronics requires enhanced cooling techniques such as immersion cooling with inert dielectric fluorinated hydrocarbons.

Figure 2:
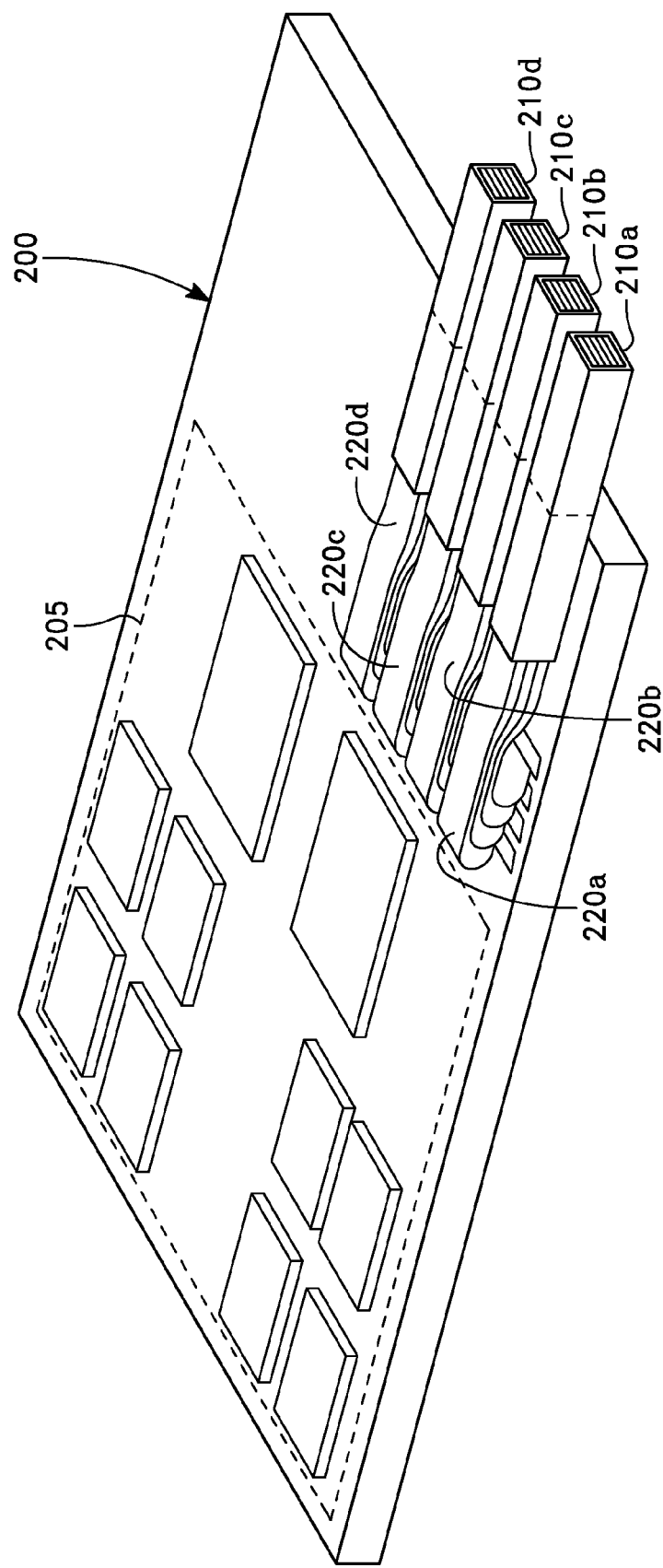
FIG. 2 is a perspective view of an embodiment of a channel board of an automatic test equipment system with connected channel board-to-DIB junction multi-modules.

As described above, the test equipment system has a number of channel or instrument boards that are placed as close as possible to a device-under-test. Currently, these channel boards are located in a "test head" which is connected to a device-interface-board (DIB) and thus to a device-under-test. FIG. 2 is a perspective view of an embodiment of a channel board of an automatic test equipment system with connected channel board-to-DIB junction multi-modules 210a, 210b, 210c, and 210d. The channel board 200 is a printed circuit board onto which the non-critical channel support electronic integrated circuitry 205 is mounted. The channel support electronic integrated circuitry 205 generally comprises the power distribution and power regulation circuitry for the channels package. Also, the channel support electronic integrated circuitry 205 provides a master oscillator to generate the master clocking for the channel board-to-DIB junction multi-modules 210a, 210b, 210c, and 210d. The channel support electronic integrated circuitry 205 also provides a memory structure for storing the test vectors and other test result reports that are transmitted from and to the tester control circuitry. Other non-critical test support functions will also be performed by the channel support electronic integrated circuitry 205.

The channel board-to-DIB junction multi-modules 210a, 210b, 210c, and 210d are secured mechanically to the channel board 200 with a mechanical frame (not shown). The electrical connections between the channel board 200 and the channel board-to-DIB junction multi-modules 210a, 210b, 210c, and 210d are through the ribbonized flex-cables 220a, 220b, 220c, and 220d.

The channel board-to-DIB junction multi-modules 210a, 210b, 210c, and 210d may provide the high performance drive capability for the test stimulus signals to the device-under-test, and the comparator and load functions for the test response signals for the device-under-test. As the performance of the device-under-test increases, the clock frequency increases, and the delays of the device-under-test decreases, more performance critical electronics signals may be packaged in the channel board-to-DIB junction multi-modules 210a, 210b, 210c, and 210d. Thus, the channel board-to-DIB junction multi-modules 210a, 210b, 210c, and 210d may also include the test stimulus generator, the test signal formatter, and the test stimulus signal timing generator. Also, the channel board-to-DIB junction multi-modules 210a, 210b, 210c, and 210d may include the test response signal timing recovery circuit, and the test response signal error compare and recording circuit.

Figure 3:
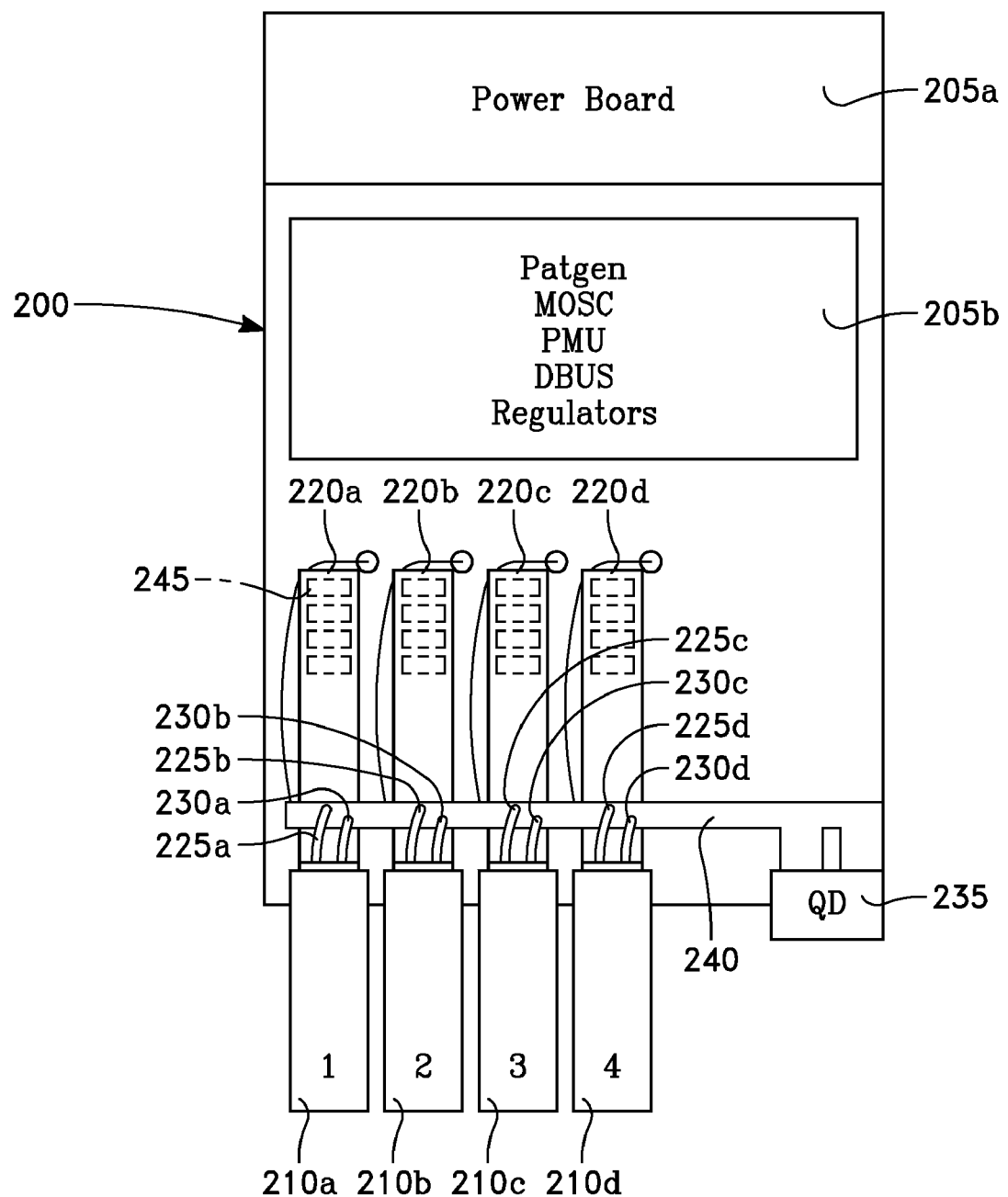
FIG. 3 is a top view of an embodiment of a channel board of an automatic test equipment system with the one channel board-to-DIB junction multi-module.

FIG. 3 is a top view of an embodiment of a channel board of an automatic test equipment system with channel board-to-DIB junction multi-modules 210a, 210b, 210c, and 210d. The ribbonized flex-cables 220a, 220b, 220c, and 220d are attached to the channel board 200 either by direct soldering or brazing of the pads 245 of the ribbonized flex-cables 220a, 220b, 220c, and 220d to pads on the channel board 200 or as compliant/press-fit connector as is known in the art.

The channel board-to-DIB junction multi-modules 210a, 210b, 210c, and 210d have input fluid coolant connections 225a, 225b, 225c, and 225d and return fluid coolant connections 230a, 230b, 230c, and 230d that provide a coolant medium. In the present embodiment the coolant medium is an inert dielectric fluorinated hydrocarbons, such as Novec HFE-7100 from 3M Corporation, St. Paul, Minn. The input fluid coolant connections 225a, 225b, 225c, and 225d and return fluid coolant connections 230a, 230b, 230c, and 230d are connected to the coolant manifold 240. The coolant manifold 240 is connected to a coolant distribution connected to a quick disconnect connector 235.

The non-critical channel support electronic integrated circuitry 205a and 205b provides the power generation, regulation, and distribution circuitry for the channel board-to-DIB junction multi-modules 210a, 210b, 210c, and 210d. Non-critical channel support electronic integrated circuitry 205a and 205b further includes a precision measurement unit (PMU) for precision measurement of DC and near DC signals, which are not as severely degraded by the interconnections between the device-under-test and the channel board 200. Other functions of the non-critical channel support electronic integrated circuitry 205a and 205b include a master oscillator, pattern generator, and data bus drivers and receivers for transfer of test vectors to the channel board-to-DIB junction multi-modules 210a, 210b, 210c, and 210d.

Although not shown in FIG. 2 or 3, the channel board-to-DIB junction multi-modules 210a, 210b, 210c, and 210d may be secured to the channel board 200 directly or indirectly with a mechanical frame (not shown), in various embodiments.

In some embodiments, there may be a compliant connection associated with the channel board-to-DIB junction multi-modules 210a, 210b, 210c, and 210d, in accordance with the teaching of U.S. Patent Publication 2007/0004238 by Breinlinger, et al., assigned to the same assignee as this invention, herein incorporated by reference in its entirety. For example, in some embodiments, a mounting bracket (not shown) is secured to the channel board 200 and the channel board-to-DIB junction multi-modules 210a, 210b, 210c, and 210d, are connected to the mounting bracket via a compliant connection, to facilitate mating of the channel board-to-DIB junction multi-modules 210a, 210b, 210c, and 210d with the DIB (or to some other mating connector, receptacle, board, interposer, surface, etc.).

Figure 4A:
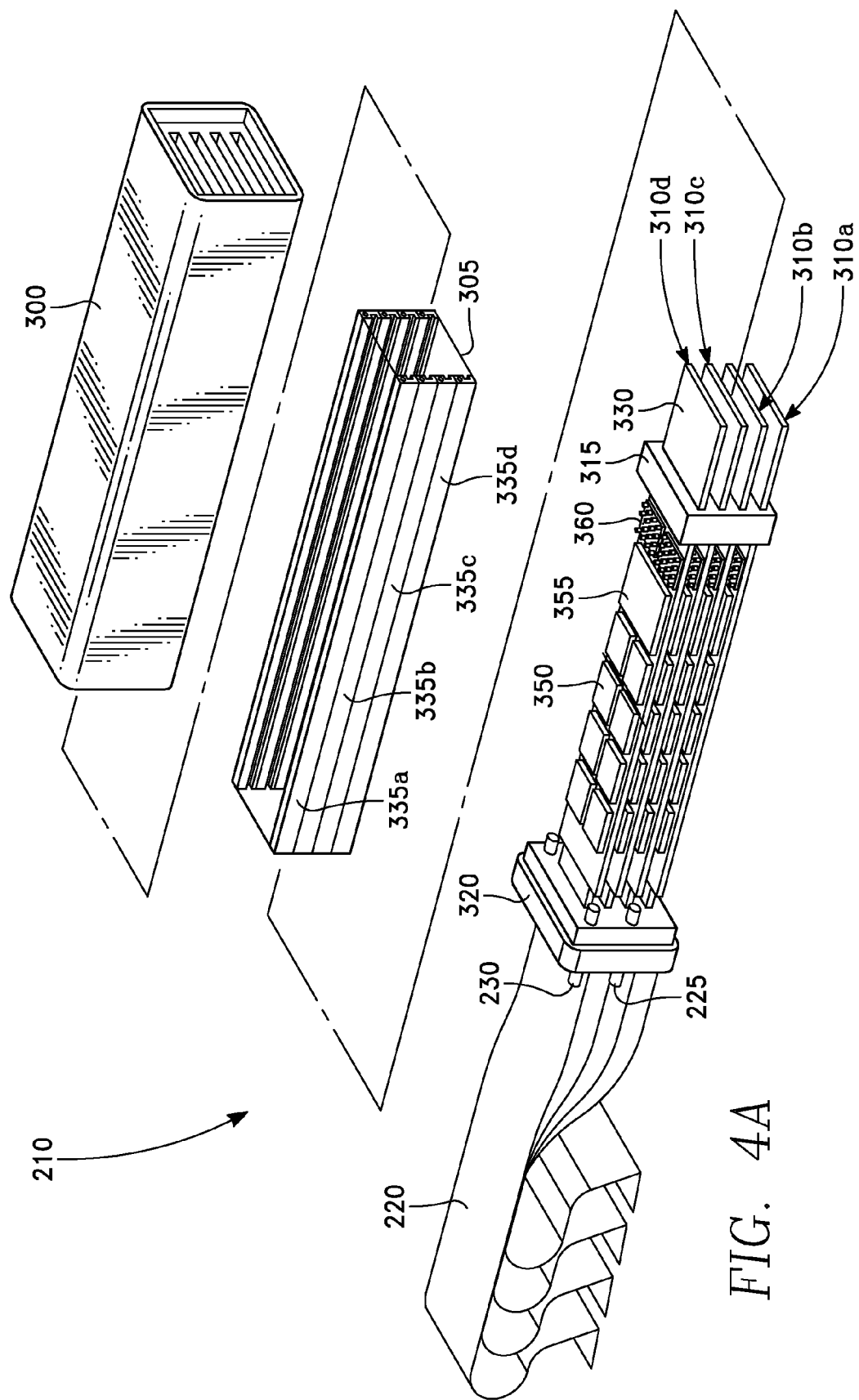
FIG. 4A is a perspective view of an embodiment of a channel board-to-DIB junction multi-module.

FIG. 4A is a perspective view of an embodiment of a channel board-to-DIB junction multi-module 210. Each of the channel board-to-DIB junction multi-modules 210 has an enclosure 300 for housing a number (4 in this embodiment) of multichip modules 310a, 310b, 310c, and 310d. In the embodiment shown, the enclosure is a tubular enclosure with a generally rectangular, or square, cross section which permits a plurality of channel board-to-DIB junction multi-modules 210a, 210b, 210c, and 210d (FIG. 2) to mate with the device interface board 20 (FIG. 1). The enclosure 300 may be sealed to allow immersion cooling of the integrated circuit chips 350, 355, and 360 of that are mounted on the multichip modules 310a, 310b, 310c, and 310d.

Each of the multichip modules 310a, 310b, 310c, and 310d has a stiffener 335a, 335b, 335c, and 335d to provide support and alignment to the multichip modules 310a, 310b, 310c, and 310d. The stiffeners 335a, 335b, 335c, and 335d may be hollow to provide a channel through which the coolant fluid flows. The coolant fluid exits at an opposite end of each of the hollow stiffeners 335a, 335b, 335c, and 335d and to cool the high power consuming integrated circuit chips 360 first. The structure of cooling mechanism for the multichip modules 310a, 310b, 310c, and 310d is described hereinafter. The hollow stiffeners 335a, 335b, 335c, and 335d provide a partial or full frame, which may be placed and secured in an optional insert 305, which is placed in the enclosure 300.

The multichip modules 310a, 310b, 310c, and 310d are performance critical channel electronics modules onto which are mounted integrated circuit chips 350, 355, and 360, which perform at least the driver, comparator, and load functions that critical to the operation of the automatic test equipment system. Additional functions such as test stimulus pattern generation, test stimulus formatting, test stimulus timing generation, test response timing recovery, test response formatting, and/or test response error determination and recording may be incorporated as their operation becomes more important to the operation of the automatic test equipment system in the testing of an integrated circuit device.

A first end-cap seal 315 is placed at one end of each of the multichip modules 310a, 310b, 310c, and 310d for retention of the coolant medium as it passes through the channel board-to-DIB junction apparatus 210. An interposer connector area 330 is placed outside of the first end-cap seal 315 for connection of an interposer connector between the channel board-to-DIB junction multi-modules 210 and a compliant pressure connector that is discussed hereinafter.

A second end-cap seal 320 is placed at an opposite end of each of the multichip modules 310a, 310b, 310c, and 310d for further retention of the coolant medium as it passes through the channel board-to-DIB junction apparatus 210. The ribbonized flex-cables 220 are passed through the second end-cap seal 320 and attached the multichip modules 310a, 310b, 310c, and 310d. One ribbonized flex-cable 220 is generally soldered to each of the multichip modules 310a, 310b, 310c, and 310d. While the soldering is the generally accepted mode of attachment of the ribbonized flex-cable 220 to each of the multichip modules 310a, 310b, 310c, and 310d, the ribbonized flex-cable 220 may be brazed to each of the multichip modules 310a, 310b, 310c, and 310d or may have a connector system that allows connection and disconnection of the ribbonized flex-cables 220 from the multichip modules 310a, 310b, 310c, and 310d.

Figure 4B:
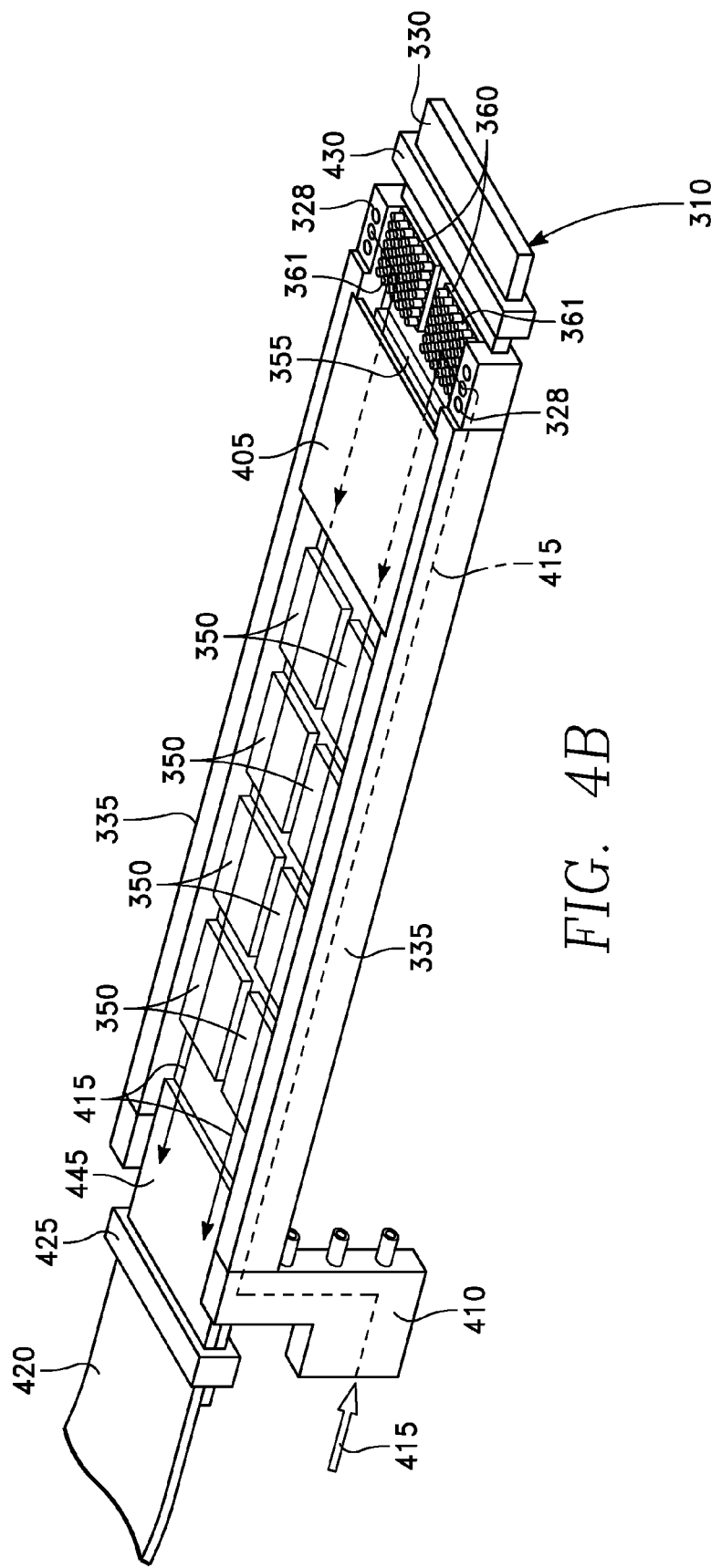
FIG. 4B is a perspective view of an embodiment of a multichip module and its attached hollow stiffener.

The end-cap seal 320 has openings that receive the input fluid coolant connections 225 and return fluid coolant connections 230 that provide the coolant medium 415, illustrated in FIG. 4B. As described above, the coolant medium 415 is an inert dielectric fluorinated hydrocarbons, such as Novec HFE-7100 from 3M Corporation, St. Paul, Minn.

FIG. 4B is a perspective view of an embodiment of a multichip module 310 and its attached hollow stiffener 335. The hollow stiffener 335 has a groove that receives the multichip module 310 to provide alignment and support. The hollow stiffener 335 is connected to an inlet manifold 410 that receives the coolant medium 415 through the input fluid coolant connections 225 of FIG. 4A. The hollow stiffener 335 further has a hollow tubing that conducts the coolant medium 415 the length of the stiffener 335 to outlets 328 that direct the coolant medium 415 to the high power consuming integrated circuit chips 360. The coolant medium 415 flows over a heat sink 361 of the high power consuming integrated circuit chips 360.

After passing over high power consuming integrated circuit chips 360, the coolant medium 415 is directed under the a fluid guide plate 405 and over the highly integrated circuit chip 355 for cooling the highly integrated circuit chip 355. The coolant medium 415 then passes over the integrated circuit chips 350. Once the coolant medium 415 passes over entire channel board-to-DIB junction multichip modules 310, the plenum area 445 collects the coolant medium 415 to be transferred through the return fluid coolant connections 230 (FIG. 4A) for recirculation. The plenum area 445 is forward of the top side seal collar 425 that contains o-rings to prevent fluid leakage. One top side seal collar 425 is mounted to each of the multichip modules 310a, 310b, 310c, and 310d of FIG. 4A. The top side seal collars 425 are incorporated in the second end-cap seal 320 of FIG. 4A. The ribbonized flex-cable 420 passes through the top side seal collar 425 and is connected to the multichip module 310 in the area of the multichip modules 310 under the plenum area 445.

The bottom side seal collar 430 contains o-rings and prevents fluid leakage. One bottom side seal collar 430 are mounted to each of the multichip modules 310a, 310b, 310c, and 310d of FIG. 4A. The bottom side seal collar 430 are incorporated in the first end-cap seal 315 of FIG. 4A.

The integrated circuit chips 350, 355, and 360 are shown as cooled directly, by directed flow of the coolant medium 415 over the integrated circuit chips 350, 355, and 360. In other embodiments the integrated circuit chips 350, 355, and 360 may be cooled with cold plates (not shown) in contact with the integrated circuit chips 350, 355, and 360 to allow the coolant medium 415 to pass within the cold plates for removal of heat from the integrated circuit chips 350, 355, and 360.

Figure 4C:
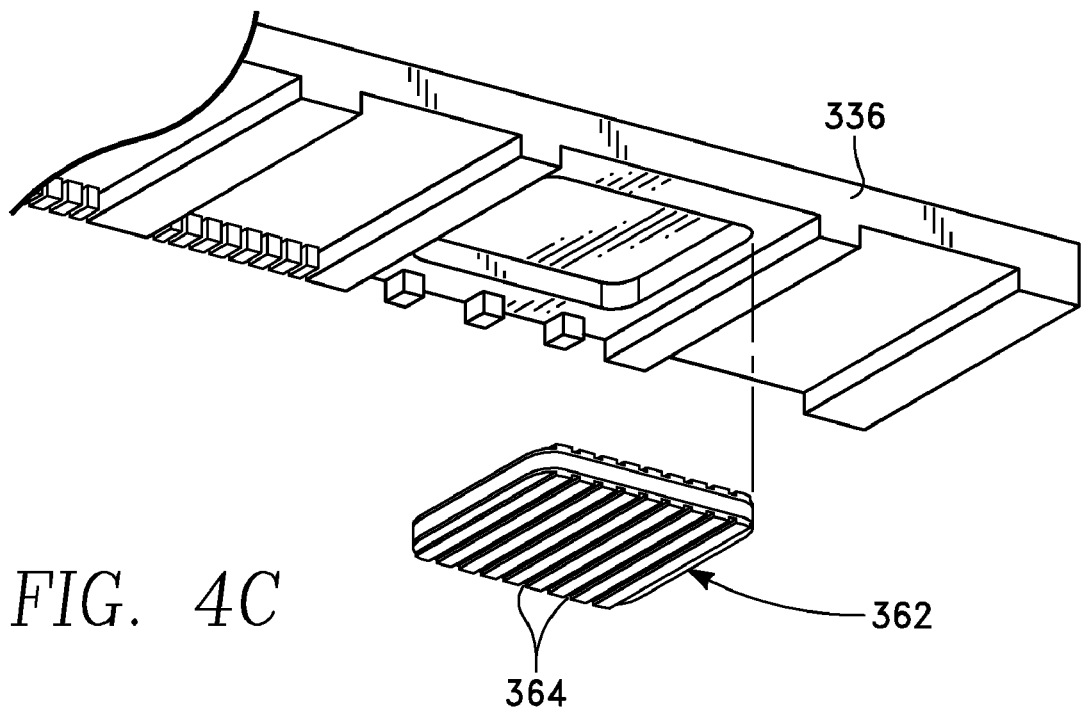
FIG. 4C is a perspective view of an embodiment of reverse heat sink.

In alternate immersion cooling embodiments, shown in FIG. 4C, the integrated circuit chips 350, 355, and 360 shown in FIG. 4B may be cooled with a reverse heat sink 362. FIG. 4C shows a perspective view of a reverse heat sink 362. The reverse heat sink 362 may seat in the stiffener 336 to direct the coolant medium over a top side of one or more of the integrated circuit chips 350, 355, and 360 using micro channels 364 in the reverse heat sink 362. In some embodiments, one or more reverse heat sink plates 362 may be mounted directly over some or all of the integrated circuit chips 350, 355, and 360.

Figure 4D:
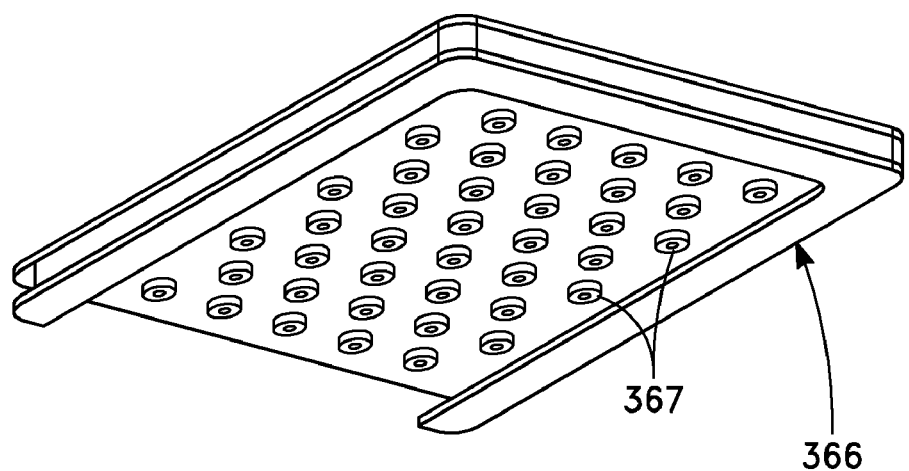
FIG. 4D is a perspective view of an embodiment of an impingement plate.

In another alternate immersion cooling embodiment, shown in FIG. 4D, impingement plates 366 adjacent to one or more the integrated circuit chips 350, 355, and 360 (FIG. 4B) may force the coolant medium 415 upon the integrated circuit chips 350, 355, and 360. With the impingement plates 366, the coolant medium 415 may be directed by, or through, the impingement plates 366 onto one or more of the integrated circuit chips 350, 355, and 360. For example, some or all of the coolant medium 415 may flow through the impingement plate insert 366 and exit through impingement jets 367 located over one or more of the integrated circuit chips 350, 355, and 360. The impingement plate 366 or the reverse heat sink 362 (FIG. 4C) may be used to focus and/or tailor fluid flow for each of the integrated circuit chips 350, 355, and 360. The impingement plate 366, or the reverse heat sink 362, or similar plates, may be separate plates, for example 405 as shown in FIG. 4B, or be integrated into, or inserted into a stiffener 336 adjacent to the stiffener holding the integrated circuit chips 350, 355, and 360.

Figure 5:
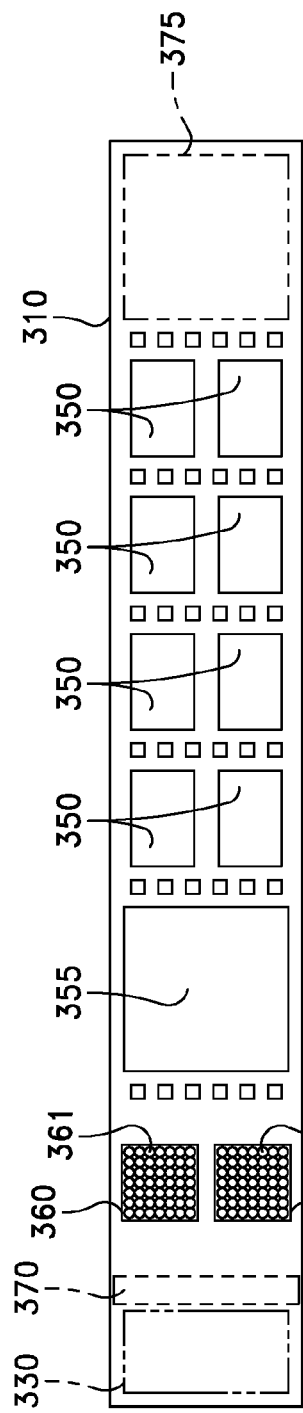
FIG. 5 is a top view of an embodiment of a channel electronics card within the one channel board-to-DIB junction multi-module.

FIG. 5 is a top view of an embodiment of one of the channel electronics multichip modules 310 within a channel board-to-DIB junction multi-module 210. The integrated circuit chips 350, 355, 360, and 365 provide the performance critical channel electronics functions such as the driver and load circuits and comparator circuits, the test stimulus pattern generation circuitry, test stimulus formatting circuitry, test stimulus timing generation circuitry, test response timing recovery circuitry, and/or test response error determination and recording incorporated in the highly integrated circuit chip 355. Any memory storage will be accommodated by the random access memory (RAM) chips 350. These chips may be dynamic RAM chips or static ram chips as required by the performance of the particular function.

The ribbonized flex-cable 420 of FIG. 4B is connected to the multichip module 310 at the location 375. The interposer connector is attached at the interposer connector area 330 to provide the connection from the multichip modules 310 to the transfer board that is to be discussed hereinafter. The bottom side seal collar is mounted to the area 370 to prevent leakage of the coolant medium from the enclosure housing the multichip module 310.

Figure 6:
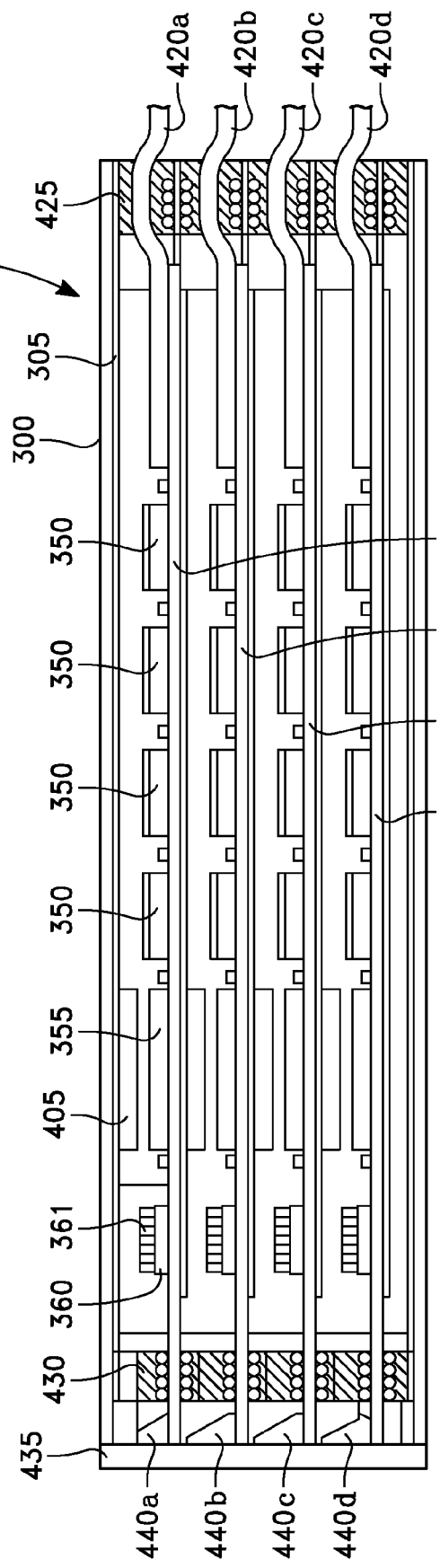
FIG. 6 is a front view of an embodiment of a one channel board-to-DIB junction multi-module.

FIG. 6 is a front view of an embodiment of a one channel board-to-DIB junction multi-module. The channel board-to-DIB junction multi-module 210 has the enclosure 300 into which a card guide insert 305 is placed and secured. Performance critical channel electronics modules 310a, 310b, 310c, and 310d are inserted and secured with their hollow stiffeners 335 of FIG. 4B into the card guide insert 305.

Each of the performance critical channel electronics modules 310a, 310b, 310c, and 310d include the high power consuming integrated circuit chips 360, the highly integrated circuit chips 355 such as the test stimulus pattern generation circuitry, test stimulus formatting circuitry, test stimulus timing generation circuitry, test response timing recovery circuitry, and/or test response error determination and recording. Any memory storage will be accommodated by the random access memory (RAM) chips 350. These chips may be dynamic RAM chips, such as double data rate dynamic random access memory (DDR DRAM), or static ram chips as required by the performance of the particular function.

A top side seal collar 425 and a bottom side seal collar 430 are mounted to each of the multichip modules 310a, 310b, 310c, and 310d and collectively are placed at each end of the enclosure 300 to prevent leakage of a coolant medium from the enclosure 300. The top side seal collar 425 contains o-rings and prevents fluid leakage. Each of the ribbonized flex-cables 420a, 420b, 420c, and 420d passes through one of the top side seal collars 425. One of the ribbonized flex-cables 420a, 420b, 420c, and 420d is attached to each of the performance critical channel electronics modules 310a, 310b, 310c, and 310d as described above. The enclosure 300 and the ribbonized flex-cables 420a, 420b, 420c, and 420d are secured to the channel board as described above.

Each of the performance critical channel electronics modules 310a, 310b, 310c, and 310d passes through one of the bottom side seal collars 430 and are connected to a cable-less connection apparatus 435. The cable-less connection apparatus 435 is connected to the performance critical channel electronics modules 310a, 310b, 310c, and 310d through the connector interposers 440a, 440b, 440c, and 440d, as described hereinafter. The cable-less connection apparatus 435 provides the necessary high frequency performance interconnections between the performance critical channel electronics modules 310a, 310b, 310c, and 310d and the device-under-test through the DIB.

Figure 7:
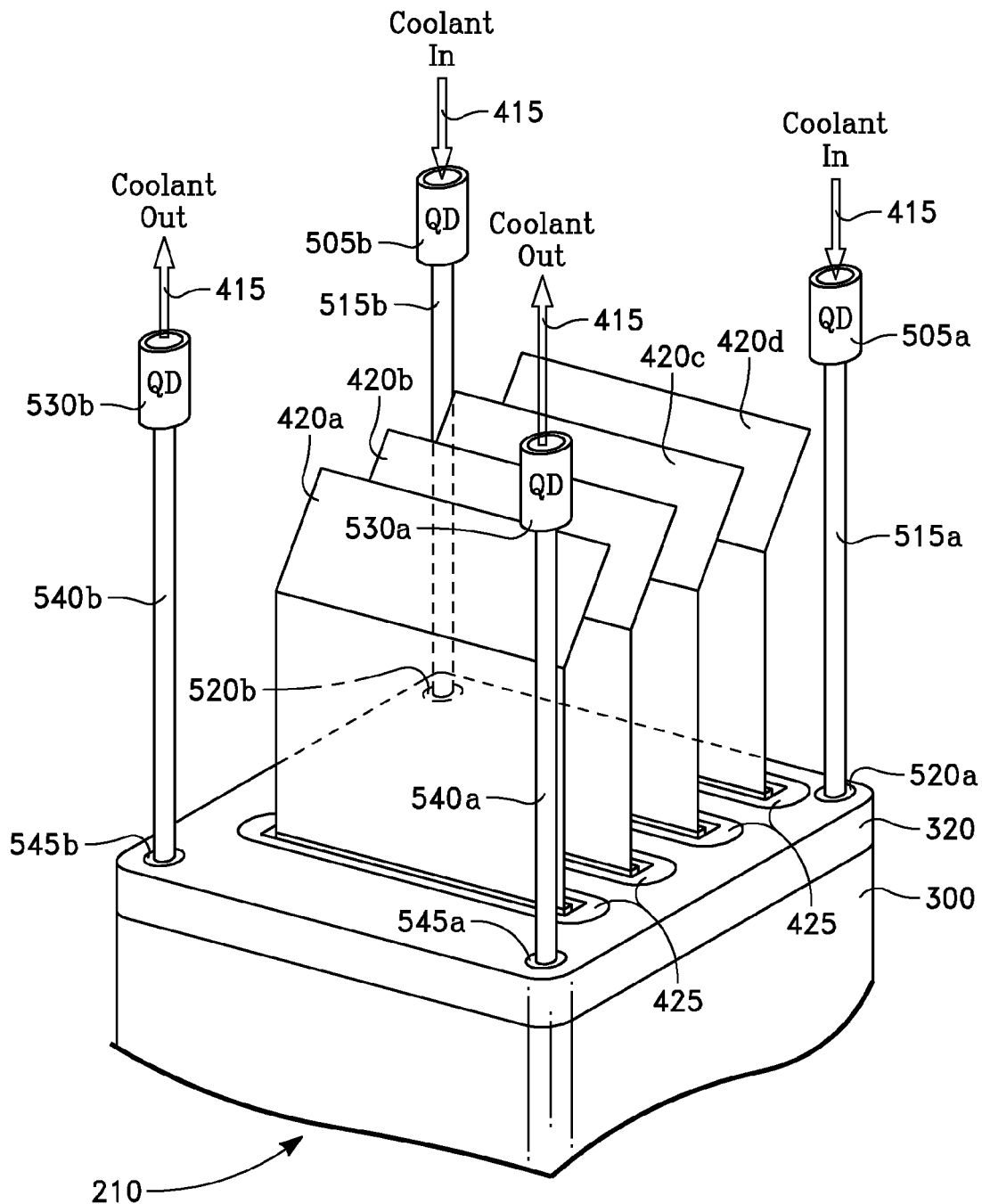
FIG. 7 is a perspective view of an embodiment of one channel board-to-DIB junction multi-module showing ribbonized flex-cables and the coolant medium distribution tubing.

FIG. 7 is a perspective view of an embodiment of one channel board-to-DIB junction multi-module 210 showing ribbonized flex-cables 420a, 420b, 420c, and 420d and the coolant medium distribution tubing. The enclosure 300 has an end-cap seal 320 that secures the seals 425 into the enclosure 300. Openings in the end-cap seal 320 and the seals 425 allow passage of the ribbonized flex-cables 420a, 420b, 420c, and 420d from the multichip modules. Couplings 520a, 520b, 545a, and 545b are inserted into openings in the end-cap seal 320 and the seals 425. Polymeric flexible tubing 515a, 515b, 540a, and 540b are inserted respectively into the couplings 520a, 520b, 545a, and 545b. Leakless quick-disconnect fittings 505a and 505b are attached to the Polymeric flexible tubing 515a, 515b to provide an entry path for the coolant medium 415 into the channel board-to-DIB junction multi-module 210. Leakless quick-disconnect fittings 530a and 530b are attached to the Polymeric flexible tubing 540a and 540b to provide an exit path for the coolant medium 415 from the channel board-to-DIB junction multi-module 210. It should be noted that any appropriate flexible tubing that provides the suitable integrity to prevent leakage of the coolant medium 415 and longevity of operation is in keeping with intent of this embodiment.

The polymeric flexible tubing 515a and 515b may be joined to a single polymeric flexible tubing with a Y-fitting (not shown). A single quick disconnect fitting would be used for this purpose rather than the two leakless quick-disconnect fittings 505a and 505b. Similarly, the polymeric flexible tubing 530a and 530b may be joined to a single polymeric flexible tubing with a Y-fitting (not shown). A single quick disconnect fitting would be used for this purpose rather than the leakless quick-disconnect fittings 530a and 530b.

Figure 8C:
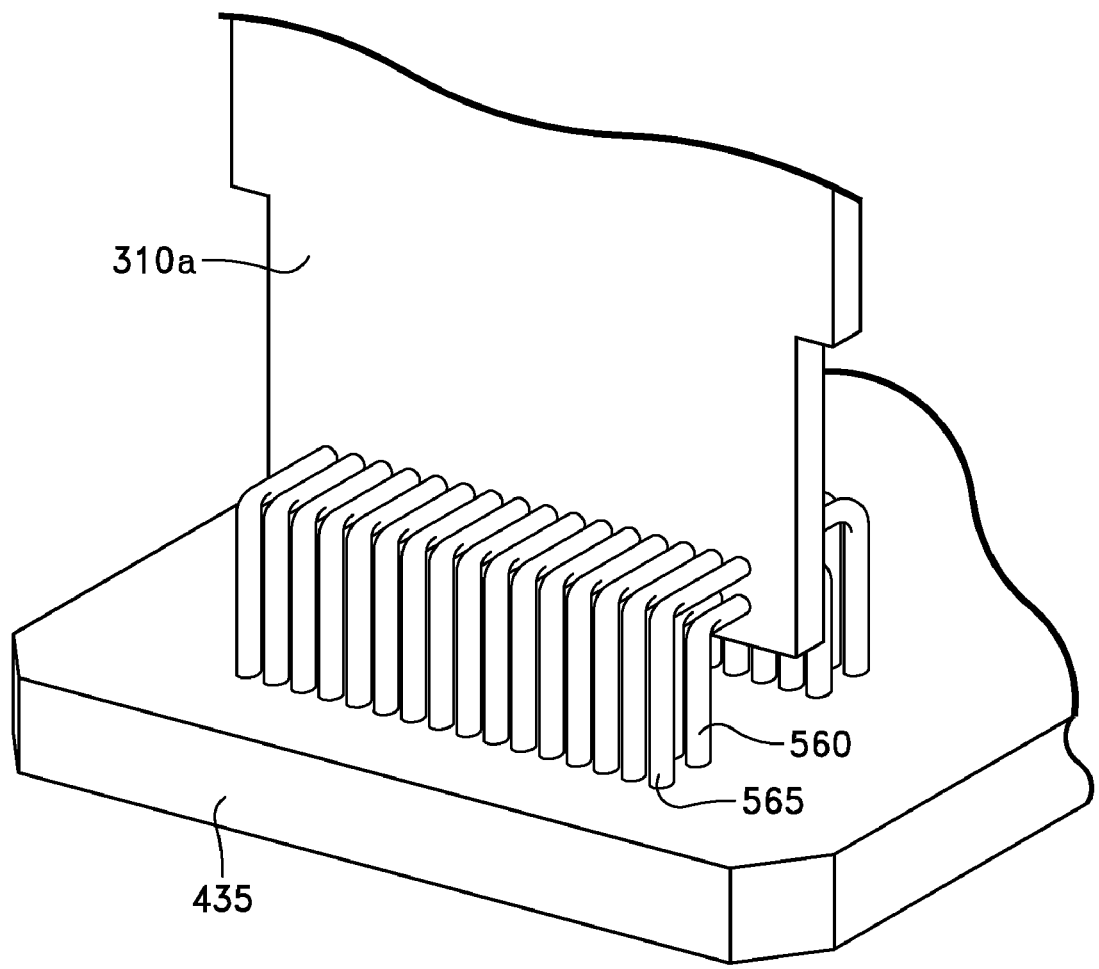

FIGS. 8A-8C are perspective views of an embodiment of the connection system of the compliant-pressure connector between a device interface board and the one channel board-to-DIB junction multi-module 210. The first end-cap seal 315 is fit to the ends of the performance critical channel electronics modules 310a, 310b, 310c, and 310d and placed in the enclosure 300. The end-cap seal 315 encompasses the bottom side seal collars 430 to prevent leakage of the coolant medium.

The space between the first end-cap seal 315 and the cable-less connection apparatus 435 is an open area where the electrical connections are made from the performance critical channel electronics modules 310a, 310b, 310c, and 310d to the cable-less connection apparatus 435. The electrical connections from the performance critical channel electronics modules 310a, 310b, 310c, and 310d to the cable-less connection apparatus 435 are the connector interposers 440a, 440b, 440c, and 440d, which can be made in several ways. For lower frequency signals (up to 1 Gbps), conventional edge connectors with conductors on 0.5 mm pitch can be used. For higher data rates, such as the 8 Gbps, custom connector solutions must be developed. There are several types of connector technology that may be used, including edge-mounted interposer, bent-pin and elastomer-based connectors. In all cases, each signal conductor requires a set of ground conductors to provide shielding and controlled characteristic impedance. FIGS. 8A and 8C illustrates an example of an edge-mounted interposer 560 and 565 with a dielectric frame removed. This type of conductor 560 and 565 is bonded to pads 570a, 570b, 570c, and 570d on both surfaces of the performance critical channel electronics modules 310a, 310b, 310c, and 310d and the conductors 560 and 565 are curved towards the cable-less connection apparatus 435. The conductors 560 and 565 provide compliance and make connections when the interposer conductors 560 and 565 are pressed onto the pads 575a, 575b, 575c, and 575d.

In other embodiments, 560 and 565 may be conductor pins that extend into the cable-less connection apparatus 435, or into a surface mount connector. In yet other embodiments, edge contacts (not shown) on the performance critical channel electronics module 310a may directly or indirectly contact surface pads on the performance critical channel electronics module 310a.

As noted above, the cable-less connection apparatus 435 provides the necessary high frequency performance interconnections between the performance critical channel electronics modules 310a, 310b, 310c, and 310d and the device-under-test through the DIB. The DIB side 555 of the cable-less connection apparatus 435 preferably allows board to board interconnections, which may include a compliant connection such as an interposer (not shown). The cable-less connection apparatus 435 may be a printed pad-to-printed pad PCB translator board as shown. Other examples of the types of connectors that may be used in this type of application include the compression board-to-board connectors from Tyco Electronics, Berwyn, Pa.; or Connector-to-pad printed circuit board translator as described in U.S. Patent Application Pub. No. 2007/0007034 (Behziz, et al.), assigned to the same assignee as this invention, herein incorporated by reference in its entirety. The listed examples are by no means complete and only provide illustrations of the appropriate types of connector for the signal fidelity required of the automatic test equipment of the embodiment described.

Figure 9:
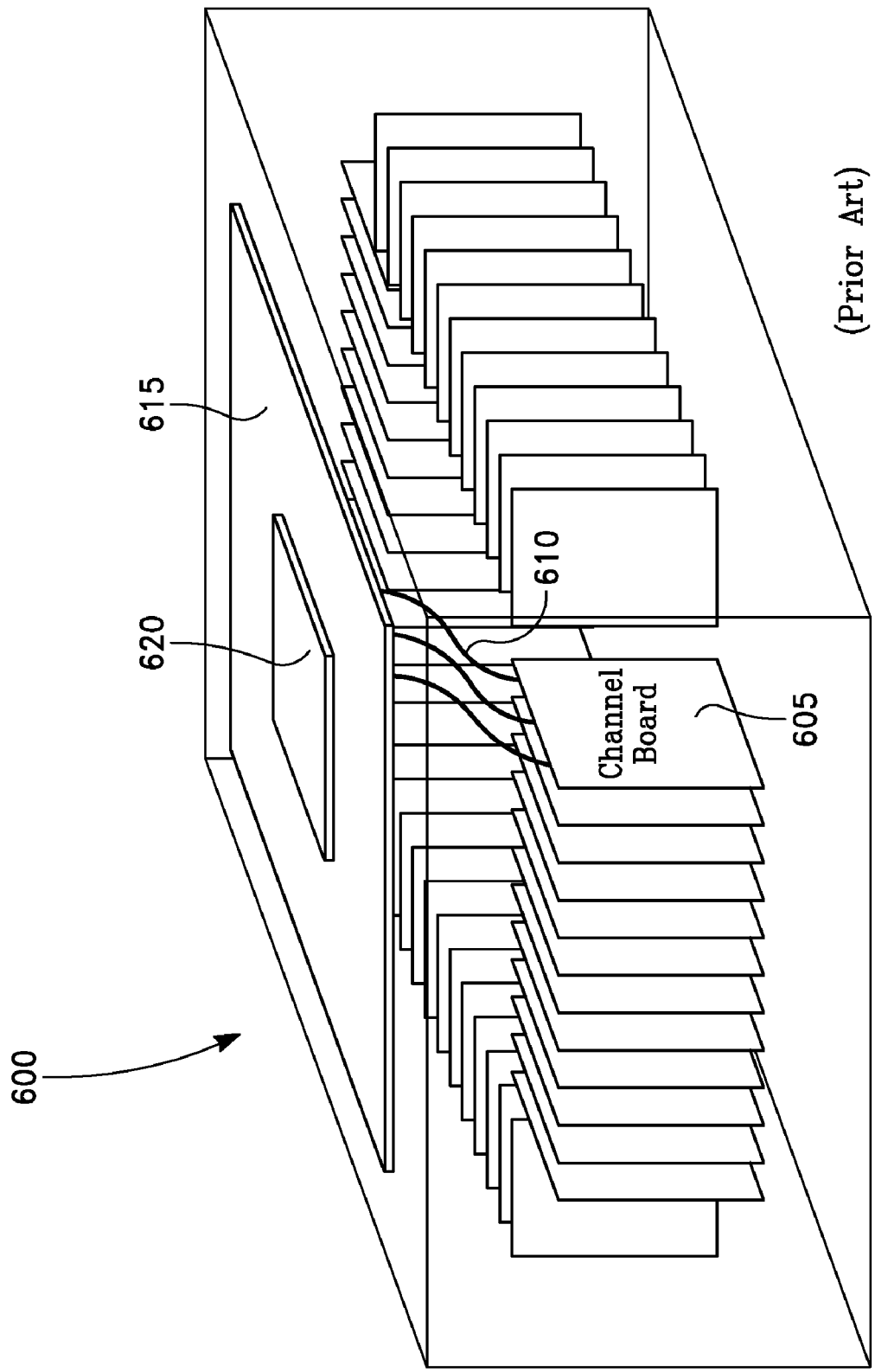
FIG. 9 is a diagram of a test head of automatic test equipment of the prior art.
Figure 10:
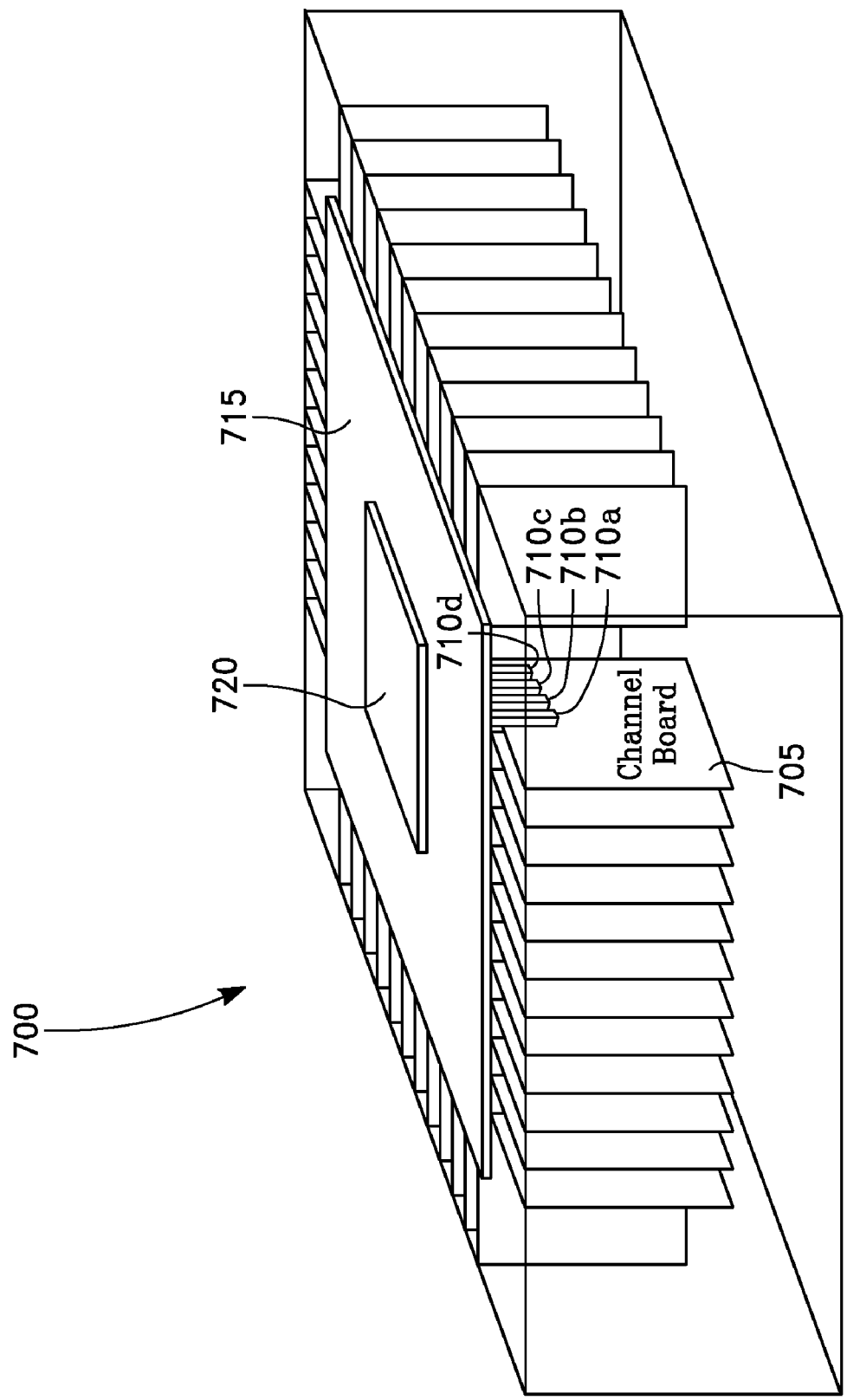
FIG. 10 is a diagram of an embodiment of a test head of automatic test equipment.

FIG. 9 is a diagram of a test head of automatic test equipment of the prior art. FIG. 10 is a diagram of an embodiment of a test head of automatic test equipment. In FIG. 9, the prior art test head 600 has a number of channel boards 605 connected through a number of coaxial cables 610 to the device interface board (DIB) 615. The DIB 615 provides the necessary connections from the coaxial cables 610 to a device-under-test (DUT) 620. Performance and miniaturization of transistors have resulted in challenges in coaxial cable 610 assembly and performance. The sheer volume of several thousand 2-foot coaxial cables 610 is causing problems for manufacturing engineering, where man-years of work are required to repeatably route and restrain the mass of heavy and expensive coaxes. Design compromises between cable diameter and signal fidelity are becoming tougher. The solution for the problems of the mass of cable 610 is to move the channel electronics (pin electronics) boards 650 directly under the DIB 615 where the performance critical channel electronics such as driver, load, and comparator circuits can have cable-less access to the DUT 620.

In the test head 700 of FIG. 10, the channel boards 705 are elevated to be in close proximity to the DIB 715. Channel board-to-DIB junction multi-modules 710a, 710b, 710c, and 710d are secured and connected to each of the channel boards 715. The channel board-to-DIB junction multi-modules 710a, 710b, 710c, and 710d are connected as described above to the DIB 715 through the cable-less connection apparatus 435 of FIG. 6 to provide the connections between the performance critical channel electronics and the DUT 720 through the DIB 715.

Although the number of conductors connecting these channel board-to-DIB junction multi-modules 710a, 710b, 710c, and 710d to the channel boards 705 is large, the performance requirements are limited to lower frequency and bandwidth requirements of approximately 500 Mbps. The low-cost, ribbonized flex-cables 220a, 220b, 220c, and 220d of FIG. 2 suffice to provide the power and other signals between the channel boards 705 and the channel board-to-DIB junction multi-modules 710*a*, 710*b*, 710*c*, and 710*d*. The ribbonized flex-cables 220*a*, 220*b*, 220*c*, and 220*d* of FIG. 2, like the electronics they are connected to, are arranged vertically, avoiding the "tangle" problem with the coax cables. As the performance requirements are increased, the channel board-to-DIB junction multi-modules 710*a*, 710*b*, 710*c*, and 710*d* may also include stimulus pattern generation circuitry, test stimulus formatting circuitry, test stimulus timing generation circuitry, test response timing recovery circuitry, and test response error determination and recording circuitry.

The channel board-to-DIB junction multi-modules 710*a*, 710*b*, 710*c*, and 710*d* may be mounted in a floating interface assembly as taught in U.S. Patent Application 2006/0073723 (Cowgill, et al.), incorporated herein by reference in its entirety and assigned to the same assignee as this invention. The ribbonized flex-cables 220*a*, 220*b*, 220*c*, and 220*d* of FIG. 2 are connected between the channel boards 705 and the channel board-to-DIB junction multi-modules 710*a*, 710*b*, 710*c*, and 710*d*. A floating interface assembly (not shown), may hold the channel board-to-DIB junction multi-modules 710*a*, 710*b*, 710*c*, and 710*d* and place the channel board-to-DIB junction multi-modules 710*a*, 710*b*, 710*c*, and 710*d* in contact with the DIB 715 to make a compressive and compliant connection between the channel board-to-DIB junction multi-modules 710*a*, 710*b*, 710*c*, and 710*d* and the DIB 715. In some embodiments, the floating interface assembly permits multiple axis movement of the cable-less connection apparatus 435 of FIG. 6 to align with the corresponding connectors of the DIB 715.

While this invention has been particularly shown and described with reference to the embodiments thereof, it will be understood by those skilled in the art that various changes in form and details may be made without departing from the spirit and scope of the invention.

What is claimed is:

1. An apparatus, comprising:
 a connector configured to connect a channel board to device interface board (DIB), the connector comprising:
 a) a plurality of channel electronics integrated circuits comprising pin electronics for a plurality of channels:
 b) an enclosure at least partially enclosing the plurality of channel electronics integrated circuits;
 c) a coolant distribution apparatus configured to provide cooling to the plurality of channel electronics integrated circuits;
 d) a channel board connection portion coupled to the plurality of channel electronics integrated circuits and configured to couple electrical signals between the plurality of channel electronics integrated circuits and the channel board; and
 e) a cable-less connection portion coupled to the plurality of channel electronics integrated circuits and configured to couple electrical signals between the plurality of channel electronics integrated circuits and the DIB, the cable-less connection portion being at least partially accessible through the enclosure of the connector.

2. The apparatus of claim 1, wherein the coolant distribution apparatus comprises fluid conduits within the enclosure.

3. The apparatus of claim 2, wherein the plurality of channel electronics integrated circuits are mounted in a frame of the enclosure comprising the fluid conduits.

4. The apparatus of claim 2, wherein the plurality of channel electronics integrated circuits are mounted in stiffeners within the enclosure, and wherein the stiffeners comprise the fluid conduits to direct a coolant medium within the enclosure.

5. The apparatus of claim 2, further comprising at least one heat sink, and wherein the fluid conduits are configured to direct coolant medium onto the at least one heat sink.

6. The apparatus of claim 2 further comprising a reverse heat sink positioned to direct coolant medium onto at least a portion of the plurality of channel electronics integrated circuits.

7. The apparatus of claim 2 further comprising impingement plates positioned to direct coolant medium upon at least a portion of the plurality of channel electronics integrated circuits.

8. The apparatus of claim 1, wherein the coolant distribution apparatus comprises at least one cold plate in contact with the plurality of channel electronics integrated circuits.

9. The apparatus of claim 1, wherein the channel board connection portion is positioned at a channel board end of the connector, and wherein the coolant distribution apparatus comprises input and return fluid connections at the channel board end of the connector.

10. The apparatus of claim 1, wherein the channel board connection portion comprises a cable.

11. Automated test equipment adapted for use with a device interface board (DIB), the automated test equipment comprising:
 (a) a test head comprising:
 1) a plurality of channel boards; and
 2) a plurality of channel board-to-DIB connector modules configured to electrically connect the plurality of channel boards to the DIB, the plurality of channel board-to-DIB connector modules each comprising:
 i) a plurality of channel electronics; and
 ii) a cable-less connection apparatus configured to couple electrical signals between the plurality of channel electronics and the DIB; and
 3) a coolant distribution apparatus configured to cool at least some of the plurality of channel electronics.

12. The automated test equipment of claim 11, wherein the coolant distribution apparatus comprises input and return fluid connections proximate a channel board end of the plurality of channel board-to-DIB connector modules.

13. The automated test equipment of claim 11, wherein at least one of the channel board-to-DIB connector modules comprises an enclosure at least partially enclosing the plurality of channel electronics of the at least one of the channel board-to-DIB connector modules, and wherein the enclosure is sealed and the coolant distribution apparatus comprises fluid conduits to provide coolant medium into the enclosure and onto the plurality of channel electronics of the at least one of the channel board-to-DIB connector modules.

14. The automated test equipment of claim 13, wherein the at least one of the channel board-to-DIB connector modules further comprises a heat sink, and wherein the fluid conduits are configured to direct coolant medium onto the heat sink.

15. The automated test equipment of claim 13, further comprising a reverse heat sink positioned to direct coolant medium onto at least some of the plurality of channel electronics.

16. The automated test equipment of claim 13, further comprising impingement plates positioned to direct coolant medium upon at least some of the plurality of channel electronics.

17. The automated test equipment of claim 11, wherein the coolant distribution apparatus comprises at least one cold plate in contact with at least some of the plurality of channel electronics.

18. The automated test equipment of claim 11, wherein at least one of the channel board-to-DIB connector modules comprises a cable connecting the channel board-to-DIB connector module to a channel board of the plurality of channel boards.

19. Automated test equipment adapted for use with a device interface board (DIB), the automated test equipment comprising:
 a) a test head comprising:
  1) at least one channel board comprising a first channel board;
  2) a plurality of channel board-to-DIB connector modules configured to electrically connect the first channel board to the DIB, each of the plurality of channel board-to-DIB connector modules comprising:
   i) channel electronics;
   ii) an enclosure at least partially enclosing the channel electronics, the enclosure having an opening therein; and
   iii) a cable-less connection apparatus coupled to the channel electronics and having a portion exposed in the opening, the exposed portion being adapted to couple to the DIB; and
  3) coolant distribution apparatus configured to distribute a coolant medium onto the channel electronics.

20. The automatic test equipment of claim 19, wherein the coolant distribution apparatus is a liquid immersion coolant apparatus and comprises fluid conduits to provide coolant medium into the enclosure and along the channel electronics.

21. The automatic test equipment of claim 20, further comprising a heat sink, and wherein the fluid conduits are configured to direct coolant medium onto the heat sink.

22. The automatic test equipment of claim 20 further comprising a reverse heat sink positioned to direct coolant medium onto the channel electronics.

23. The automatic test equipment of claim 20 further comprising impingement plates positioned to direct coolant medium upon the channel electronics.

24. The automatic test equipment of claim 19, wherein the channel electronics are mounted in stiffeners within the enclosure, and wherein the stiffeners comprise fluid conduits.

25. The automatic test equipment of claim 19, wherein at least one of the plurality of channel board-to-DIB connector modules comprises a cable connecting the at least one channel board-to-DIB connector module to the first channel board.

* * * * *